United States Patent [19]
Heau

[11] Patent Number: 5,851,680
[45] Date of Patent: Dec. 22, 1998

[54] BORON-DOPED TITANIUM NITRIDE COATINGS AND COATED PARTS

[75] Inventor: Christophe Heau, Saint-Etienne, France

[73] Assignee: Tecmachine, France

[21] Appl. No.: 789,462

[22] Filed: Jan. 27, 1997

[30] Foreign Application Priority Data

Feb. 1, 1996 [FR] France .................................. 96 01229

[51] Int. Cl.[6] .............................. B32B 9/00; B32B 15/04; C04B 35/58
[52] U.S. Cl. ......................... 428/472; 428/698; 428/699; 501/96.1
[58] Field of Search .................................... 428/627, 698, 428/699, 472, 704; 501/96.1, 96.3, 96.4

[56] References Cited

U.S. PATENT DOCUMENTS

| | | | |
|---|---|---|---|
| 4,823,182 | 4/1989 | Okumura | 357/67 |
| 4,895,770 | 1/1990 | Schintlmeister et al. | 428/552 |
| 4,920,071 | 4/1990 | Thomas | 437/188 |
| 5,160,537 | 11/1992 | Terrat et al. | 106/36 |
| 5,318,840 | 6/1994 | Ikeda et al. | 428/336 |

FOREIGN PATENT DOCUMENTS

| | | |
|---|---|---|
| 149044A1 | 7/1989 | European Pat. Off. . |
| 685297A1 | 12/1995 | European Pat. Off. . |
| 2653452 | 1/1992 | France . |
| WO93/3195 | 2/1993 | WIPO . |

OTHER PUBLICATIONS

Chemical Abstracts, vol. 80, No. 16, 85194, Apr. 22, 1974.
Chemical Abstracts, vol. 120, No. 10, 114418, Mar. 7, 1994.
Chemical Abstracts, vol. 120, No. 16, 198322, Apr. 18, 1994.
T.P. Mollart et al., "Surface & Coatings Technology", 74–75, pp. 491–496, (no month, 1995).

Primary Examiner—John J. Zimmerman
Attorney, Agent, or Firm—Brooks Haidt Haffner & Delahunty

[57] ABSTRACT

There is disclosed a titanium nitride doped with boron crystallizing with the same structure as titanium nitride TiN and having a Vickers microhardness greater than approximately 50 GPa. There is also disclosed an anti-wear coating comprising this titanium nitride doped with boron. There are also disclosed parts such as metal parts, tungsten carbide parts and cermet parts, for example, including a coating of this type.

11 Claims, 5 Drawing Sheets

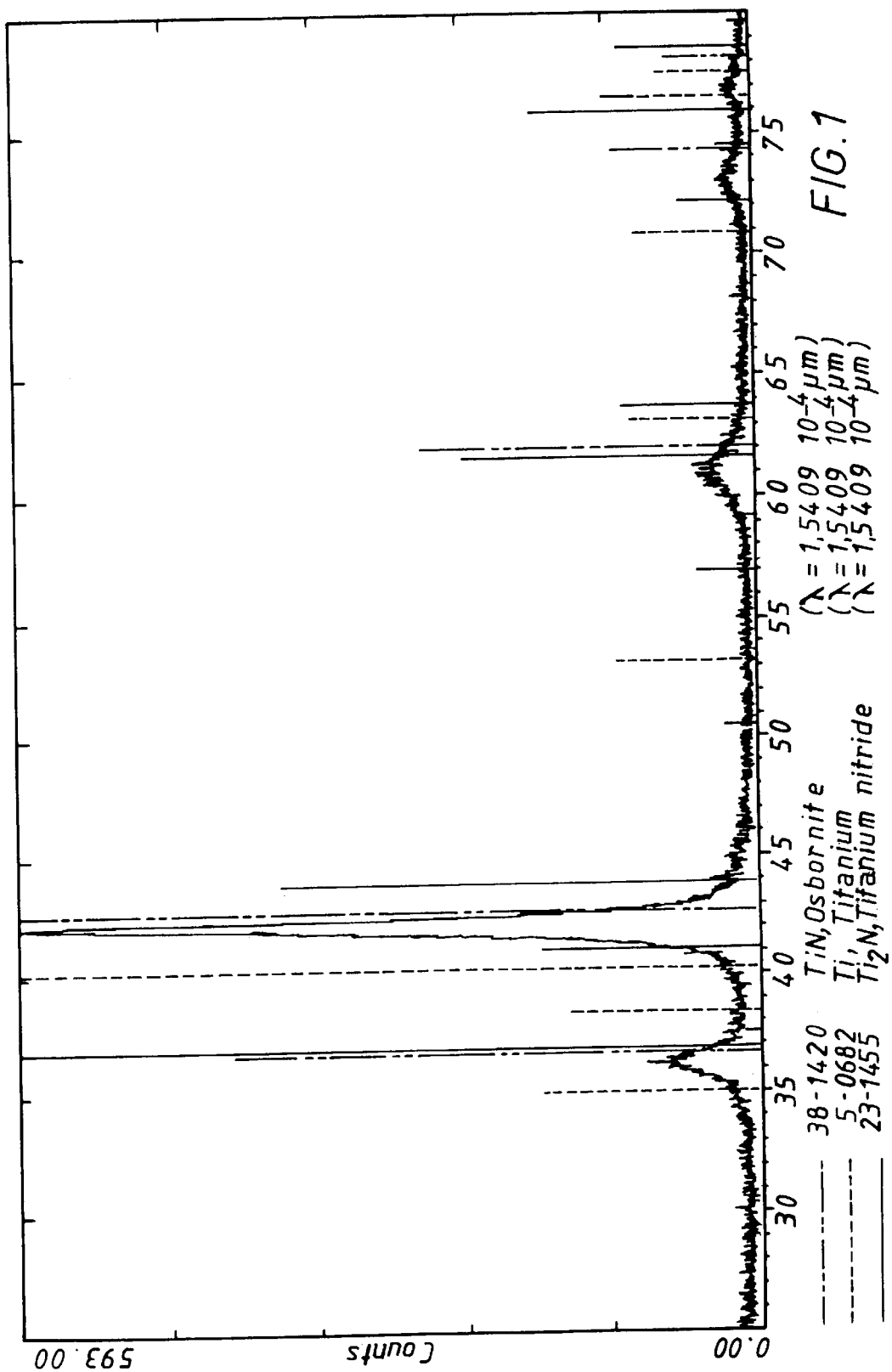

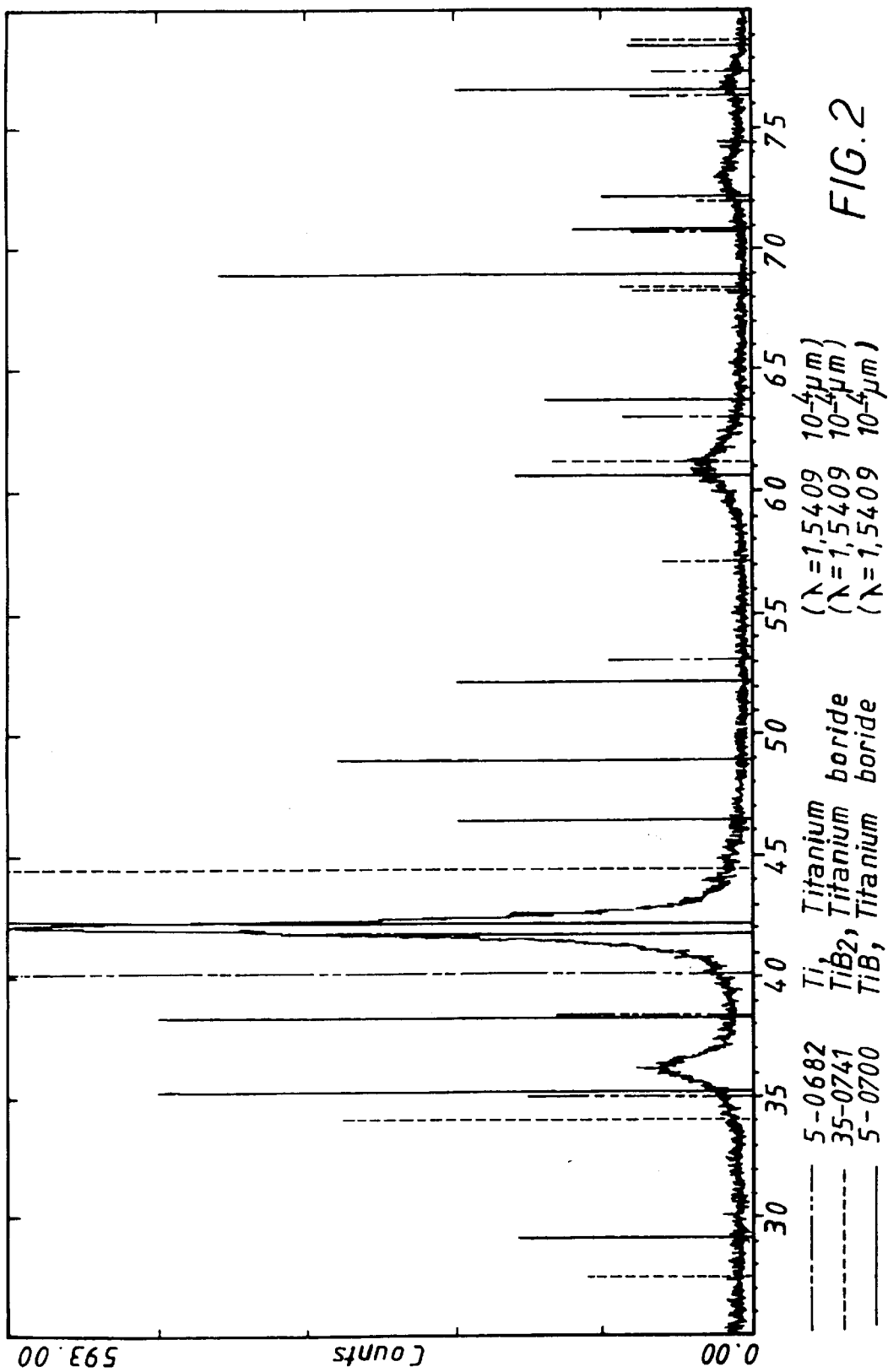

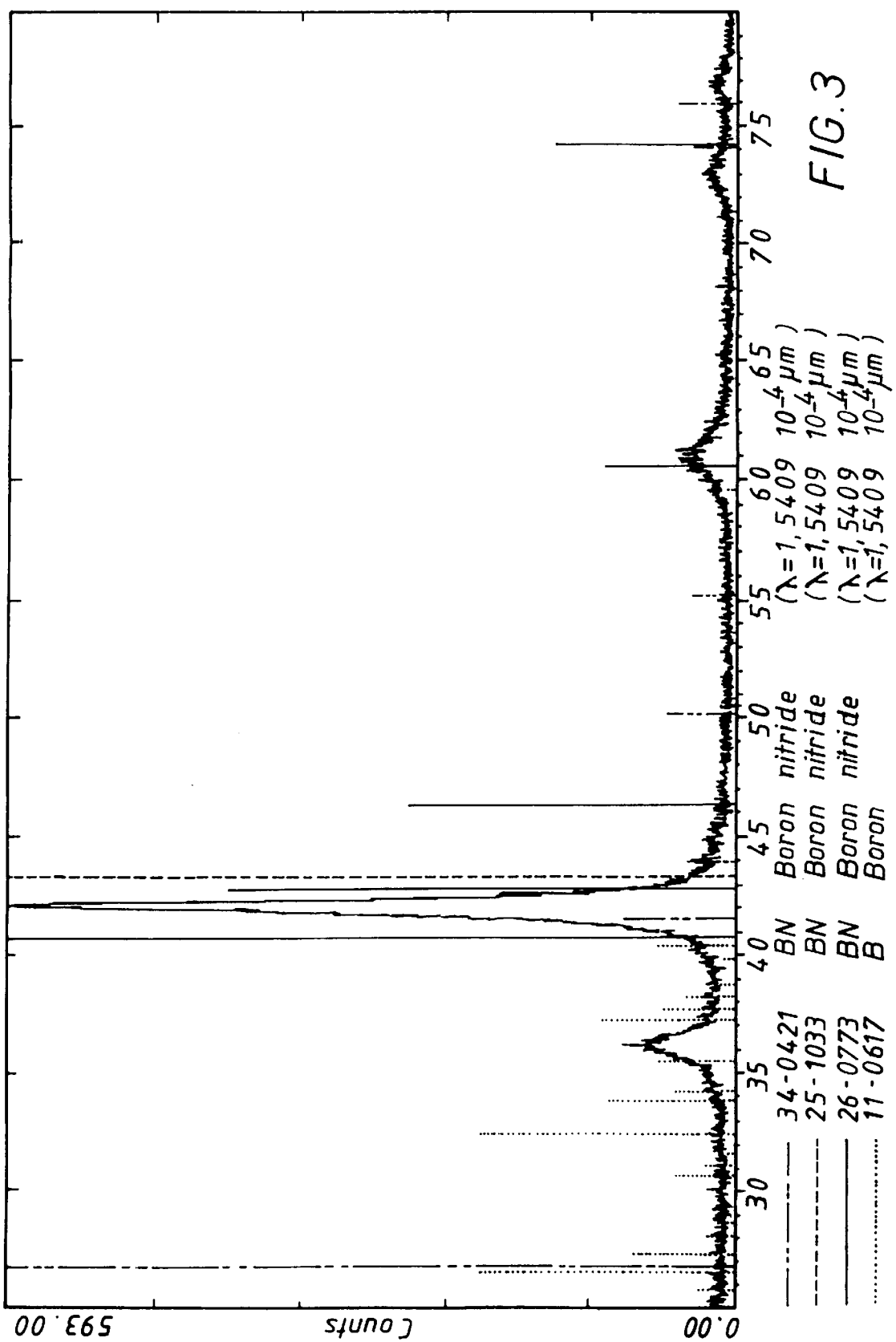

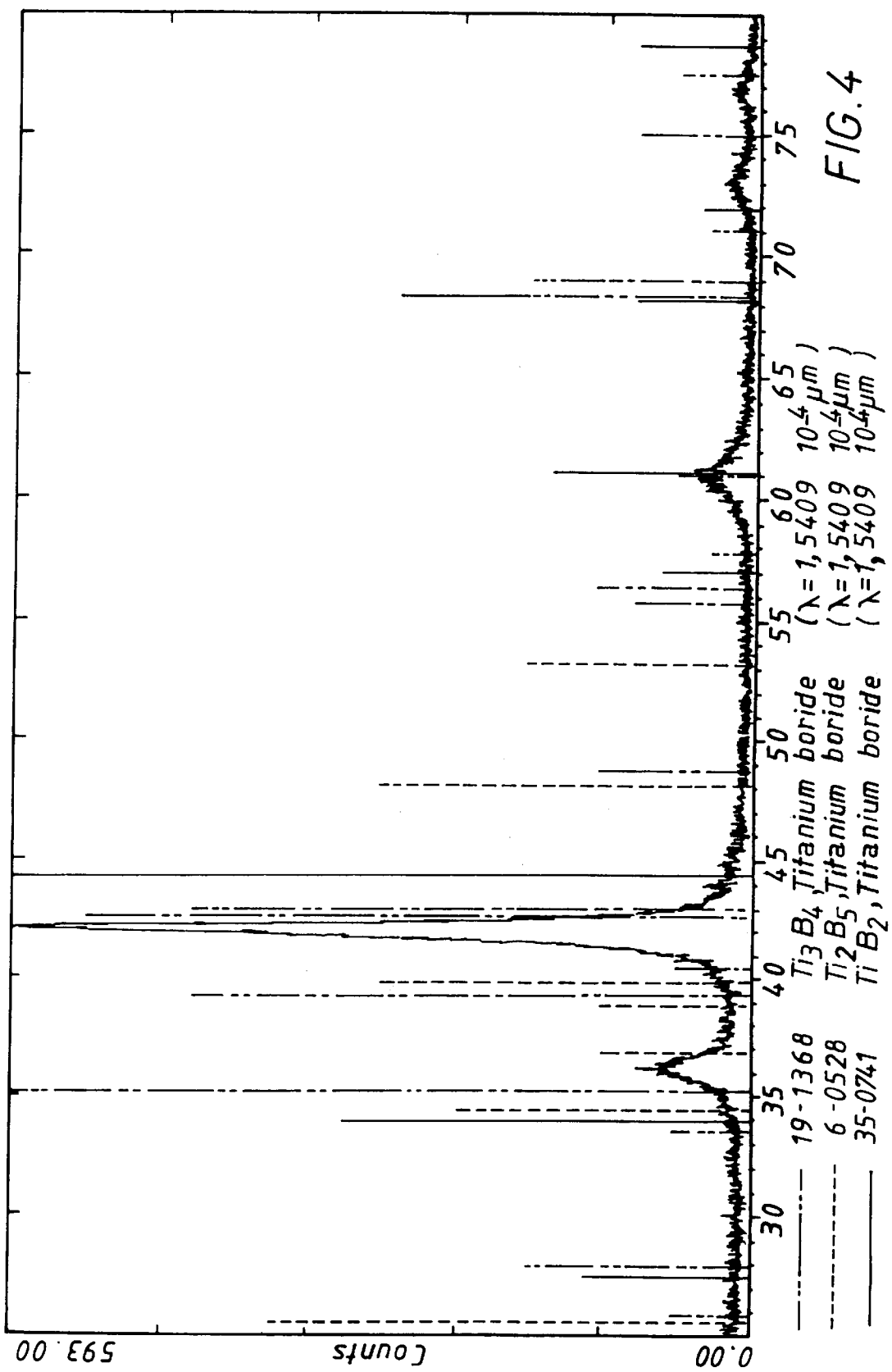

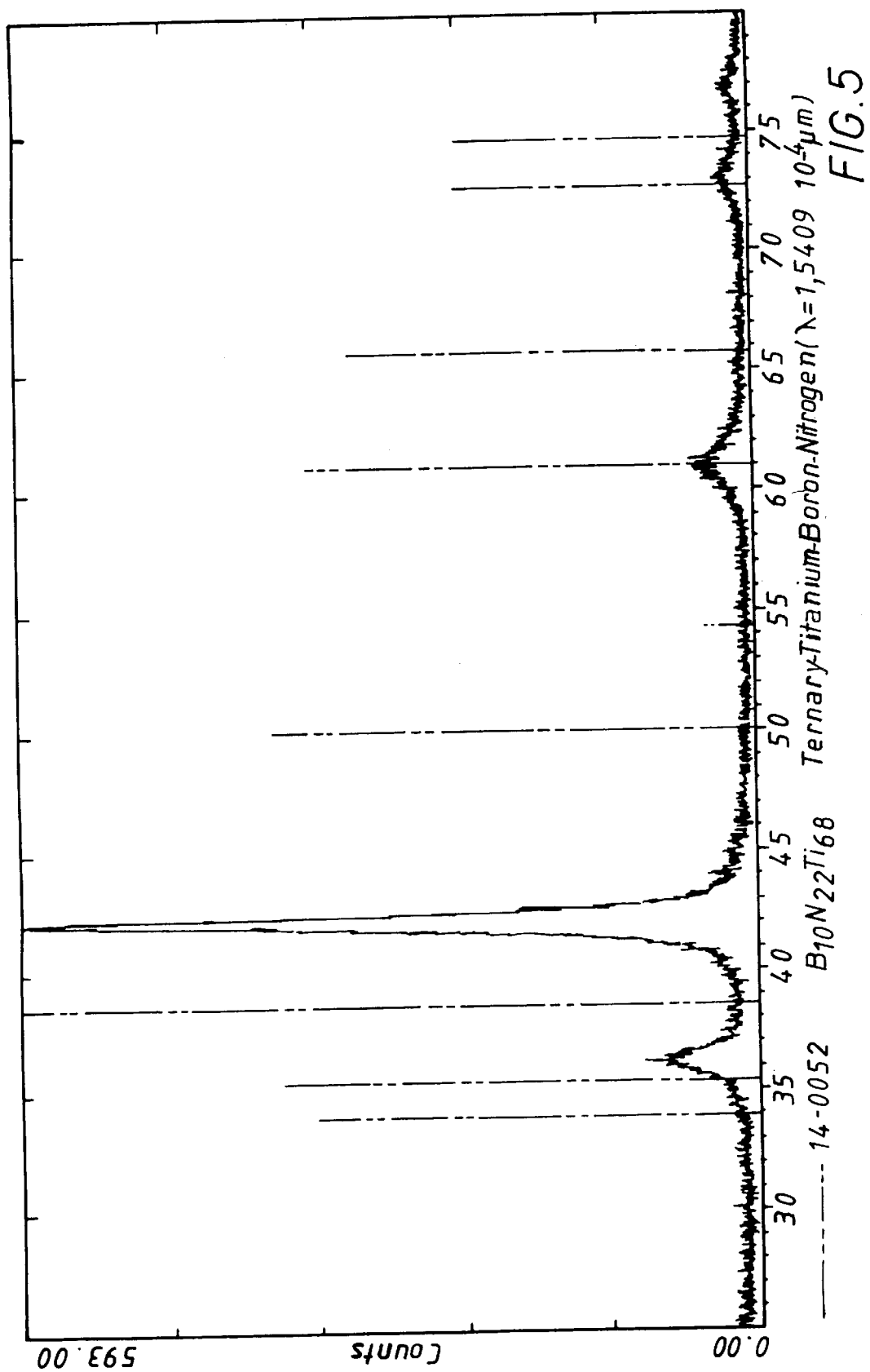

BORON-DOPED TITANIUM NITRIDE
COATINGS AND COATED PARTS

BACKGROUND OF THE INVENTION

1. Field of the invention

The present invention concerns a new compound comprising titanium nitride doped with boron. The invention is more particularly concerned with a titanium nitride doped with boron having a new composition and structure offering a remarkable combination of mechanical properties, a hardness close to that of diamond, and in any case greater than 50 GPa on the Vickers hardness scale, absence of fragility and exceptional resistance to wear.

The invention also concerns a substrate coating based on this titanium nitride doped with boron having a high hardness and very good resistance to wear. The invention further concerns parts including a coating of this kind.

2. Description of the prior art

In the case of materials, such as mechanical parts, among others, that have to resist wear, wear resistance is frequently provided by the protection conferred by a coating. In such cases, it is important for the coating to have a very high hardness but this hardness must not be obtained at the cost of an excessively high fragility that might affect the protection, for example in the event of mechanical or thermal shock. The coating must also have sufficient thermal conductivity to enable evacuation of the energy dissipated by friction. The coating must therefore be chemically and metallurgically compatible with the material of the part to be coated so as to adhere perfectly thereto.

All of these properties are required, for example, in the case of tools for shaping materials by cutting, deformation or by molding, which represents one preferred but non-limiting field of application of the invention.

It is currently routine practice to coat steel or ceramic tools to increase their resistance to wear and thereby to improve their performance. The coatings most widely used are titanium nitride coatings which are generally applied to the tools by physical or chemical vapor phase deposition techniques. More recently, in order to circumvent the limitations on application of the titanium nitride, in particular when the working temperature must be greater than around 450° C., titanium carbonitride (TiCN) coatings and mixed titanium and aluminum nitride (TiAlN) coatings have been proposed. Other nitrides of transition elements such as the chromium/nitrogen combinations described in FR-A-2 653 452 have been proposed with success.

All of the coatings described hereinabove—nitrides and carbonitrides of transition elements—have similar hardnesses, generally between 20 GPa and 35 GPa. They are generally subject to very high residual stresses which means that they cannot be used with layer thickness greater than 10 micrometers without running the risk of excessively high fragility, which is incompatible with their use under severe conditions.

At present there is no coating that can significantly exceed the level of performance obtained with the materials described hereinabove. One solution that might be envisaged, representing a major technological step forward, would be to use crystalline diamond coatings or cubic boron nitride coatings, but unfortunately the difficulties of using these do not appear to have been mastered as yet.

One object of the present invention is to achieve a significant improvement in performance over the titanium nitride coatings that today represent the benchmark in this art, with a view to improving the resistance to wear of mechanical parts, especially tools.

To this end, there is required a material having at least the following mechanical properties:

very high hardness, of at least 50 GPa, good thermal conductivity, absence of fragility, moderate internal stresses.

Until now it has been considered unlikely that these four properties could be obtained simultaneously in one material. Very high hardness is obtained with materials having covalent type chemical bonds, but this type of bond leads to unacceptable fragility, as with certain ceramics.

Thermal conductivity and absence of fragility are generally obtained with solids having ionic type bonds; this is the case with metals and alloys and also with the nitrides of chromium and of titanium already cited, but because of the very nature of these bonds the hardness never exceeds some 10 GPa for the hardest alloys or some 35 GPa for the metal/nitrogen combinations.

Entirely unexpectedly, the Applicant has discovered that doping a nitride, such as titanium nitride, with an element such as boron, can confer upon it an exceptional hardness, greater than 50 GPa, without affecting its thermal conductivity and without making it fragile. The Applicant has been able to show that the resistance to wear of a material of this kind doped with boron is very greatly improved over that of the same material without doping. The improvement is typically by a factor between 5 and 10.

It is truly a doped material, rather than a new phase, since if a phase analysis is carried out by an appropriate technique on coatings in accordance with the invention, only titanium nitride TiN (osbornite) appears, and there is no defined compound or phase containing boron. Moreover, from the structural point of view, this combination is not a boronitride proper, since these materials are fragile, but has the metallurgical structure of titanium nitride TiN, in which the boron is either inserted or substituted, so that it is truly a "titanium nitride doped with boron". The new material of the invention is a single-phase material, i.e. it includes only one metallurgical phase.

As a general rule, a material must be defined by a set of characteristics which account for its useful properties such as its hardness, impact resistance, wear resistance, resistivity, etc.

The basic characteristic to be considered is primarily the nature of the phase or the phases present since this defines the arrangement of the atoms relative to each other. The most widely used technique for identifying phases is X-ray diffraction, the sensitivity of which is directly proportional to how well the phases are crystallized. This technique is of relatively low sensitivity when the phases are microcrystalline, however. Nanocrystalline phases may even be totally undetected, and likewise amorphous phases. Other techniques can be used in this case, those most widely used being electron diffraction and Raman spectrometry.

Many materials containing titanium, nitrogen and boron are described in the prior art. In this regard, the Applicant would cite the works of W. Gissler, T. Friesen, J. Haupt and D. G. Rickerby in R. Soc. Chem. (1993), 126 (Surface Engineering, vol. 1, Fundamentals of Coatings) summarized in Chemical Abstracts, vol. 120, no. 16, 18 Apr. 1994, which the Applicant has studied. This publication describes a compound TiNx(By) which includes an amorphous phase in addition to the crystalline phase, i.e. titanium nitride in a vitreous matrix. The compound described in the above publication is a polyphase material, unlike that of the present invention, which is a single-phase material. The Applicant has further determined that the material of the above publication has high hardness and at the same time very great fragility (as determined by the scratch test).

The Applicant has also studied other works of Gissler in the publication by T. Friesen, J. Haupt, P. N. Gibson and W. Gissler, NATO ASI SER., SER. E (1993), 233 (Mechanical Properties and Deformation Behavior of Materials Having Ultra-Fine Microstructures), summarized in Chemical Abstracts, vol. 120, no. 10, 7 Mar. 1994. X-ray diffraction of deposits of the compounds of the above publication show an $AlB_2$ crystalline structure that is in no way related to the titanium nitride doped with boron of the present invention. Like the compound of the publication previously analyzed, the material of the above publication has high hardness at the same time as great fragility.

The Applicant would also cite the publication of V. N. Troitskii et al. "Preparation of Titanium Boronitride Powders in Superhigh-Frequency Discharge Plasma" summarized in Chemical Abstracts, vol. 80, no. 16, 22 Apr. 1974. The material described in the above publication is a solid solution rather than a phase. In this case the crystalline lattice is that of the titanium, deformed to a greater or lesser degree by inclusions of boron or nitrogen, whereas in the present invention the crystalline lattice is that of the TiN phase, in which the boron is probably incorporated by insertion. The solid solution of the publication by Troitskii et al. is supersaturated and metastable since annealing precipitates BN and B phases, leading to a polyphase material far removed from that of the present invention. The material of the invention is a ceramic whereas that of Troitskii et al. has the properties of a metal.

Although how the combination of the entirely remarkable properties of the new material of the invention is obtained has yet to be explained, and without wishing to be restricted to any particular theory, it is feasible that the boron atom, which is very small, could become fixed in the lattice of the titanium nitride TiN (osbornite), either replacing a nitrogen atom (TiN generally has stoichiometry defects due to missing nitrogen or titanium atoms), or at an interstitial position. It could therefore block deformation of the crystalline lattice, increasing the hardness of the material, without affecting its other properties.

SUMMARY OF THE INVENTION

Thus the present invention provides a titanium nitride doped with boron that crystallizes with the same structure as titanium nitride TiN and has a Vickers microhardness greater than about 50 GPa.

The titanium nitride doped with boron of the invention has relative proportions of its three constituents (nitrogen, titanium and boron), expressed as atomic percentages, as follows:

4%<B<28%

18%<N<34% the remainder being titanium.

The atomic percentages of the nitrogen, titanium and boron constituents of the titanium nitride doped with boron of the invention are preferably in proportions such that:

$$\frac{B+N}{Ti} = 0.75$$

It should be noted that the metallurgical structure of this new compound, titanium nitride doped with boron, is that of titanium nitride TiN into which the boron is inserted or substituted, and in particular that there are no phases of the titanium boride or titanium boronitride type.

The metallurgical structure of the new compound of the present invention will emerge more clearly from an examination of the accompanying FIGS. 1 through 5.

BRIEF DESCRIPTION OF THE DRAWINGS

FIG. 1 is an X-ray diffraction spectrum of titanium nitride according to this invention doped with boron with certain peaks marked.

FIG. 2 is an X-ray diffraction spectrum of titanium nitride according to this invention doped with boron with certain peaks marked.

FIG. 3 is an X-ray diffraction spectrum of titanium nitride according to this invention doped with boron with certain peaks marked.

FIG. 4 is an X-ray diffraction spectrum of titanium nitride according to this invention doped with boron with certain peaks marked.

FIG. 5 is an X-ray diffraction spectrum of titanium nitride according to this invention doped with boron with certain peaks marked.

DETAILED DESCRIPTION OF THE INVENTION

In each of the figures:

the vertical axis (graduated from 0 to 593) corresponds to the intensity of the X-rays;

the horizontal axis (graduated from 25° to 80°) corresponds to the swept angles 2θ in degrees;

the conditions were as follows: $CT=11.2\ s^{-1}$ (corresponding to 11.2 counts per second); $SS=0.020°$ (corresponding to the analysis angle increment graduated in θ); $\lambda=1.5409\times10^{-4}\ \mu m$ corresponds to a wavelength λ of $1.5409\times10^{-4}\ \mu m$ which is that of the $K\alpha_1$ emission line of copper;

the numbers preceding the marked compounds correspond to the ASTM numbers.

FIG. 1 shows an X-ray diffraction spectrum of a titanium nitride doped with boron of the present invention with the theoretical peaks of titanium nitride (osbornite) TiN, titanium Ti, and titanium nitride $Ti_2N$, phases marked.

FIG. 2 shows an X-ray diffraction spectrum of a titanium nitride doped with boron of the present invention with the theoretical peaks of titanium Ti, titanium boride $TiB_2$, and titanium boride TiB, phases marked.

FIG. 3 shows an X-ray diffraction spectrum of a titanium nitride doped with boron of the present invention with the theoretical peaks of boron nitride BN, boron nitride BN, boron nitride BN, and boron B, phases marked.

FIG. 4 shows an X-ray diffraction spectrum of a titanium nitride doped with boron of the present invention with the theoretical peaks of titanium boride $Ti_3B_4$, titanium boride $Ti_2B_5$, and titanium boride $TiB_2$, phases marked.

FIG. 5 shows an X-ray diffraction spectrum of a titanium nitride doped with boron of the present invention with the theoretical peaks of a ternary phase Ti-B-N (titanium boronitride), and $B_{10}N_{22}Ti_{68}$, marked.

An examination of FIG. 1 shows that the titanium nitride TiN (osbornite) phase is found in the new compound of the present invention and that the titanium phase is not found therein.

An examination of FIGS. 2 through 5 further shows that the titanium boride TiB, titanium boride $TiB_2$, titanium boride $Ti_3B_4$, titanium boride $Ti_2B_5$, boron nitride BN, titanium Ti, boron and ternary Ti-B-N titanium boronitride $B_{10}N_{22}Ti_{68}$ phases are not found in the new compound of the present invention.

The present invention also provides an anti-wear coating comprising a compound as defined hereinabove. The coating of the present invention preferably has a thickness greater than approximately 1 $\mu$m.

The material of the invention is advantageously used in the form of a coating deposited by an appropriate technology on the part that it is required to protect.

These coatings may be applied by any appropriate means; vacuum deposition technologies and more particularly cathode sputtering are preferred means of obtaining layers with a thickness, depending on the intended application, of up to several tens of micrometers. For example, a titanium-boron compound may be vaporized in a rarefied atmosphere containing nitrogen. When a Ti-B compound of this kind is vaporized, the vapor is atomic, almost always mono-atomic, and contains atoms of Ti, atoms of B and atoms of N. The titanium becomes associated with the nitrogen and the boron is inserted into the titanium nitride formed in this way.

In accordance with the present invention the coatings may be applied to metal parts, of ferrous alloys among others, and to ceramic parts such as tungsten carbide or cermet parts, for example.

The invention will now be described in more detail by means of the following non-limiting examples.

EXAMPLE 1

A 10 micrometers thick layer of titanium nitride doped with boron in accordance with the invention was deposited on a 36 mm×18 mm×8 mm carbon steel plate. To this end, the plate was placed in a magnetron cathode sputtering deposition machine fitted with a target based on a boron-titanium compound that was sputtered in an atmosphere of argon and nitrogen at reduced pressure. The operating conditions were as follows:

| | |
|---|---|
| Partial pressure of argon | 2.2 Pa |
| Partial pressure of nitrogen | 0.05 Pa |
| Cathode power | 1.8 kW |
| Treatment time | 60 minutes |

The characterization tests usually employed to assess this type of material were carried out on the coated part, namely:

Elemental chemical analysis by glow discharge spectrometry.

Measurement of surface hardness by Vickers microindentation.

Surface scratching in the standard scratch test for measuring the adhesion and the fragility of the coating at the same time; the result is qualified by the load at which scaling occurs.

Wear resistance measured by rubbing the plate with an abrasive ring charged with silicon carbide. The linear speed was 0.55 m/s, the applied load was 5 daN and the duration of the test was 10 minutes. The test was carried out in water in order to evacuate the heat produced by the friction and the result was expressed in the form of the wear rate in micrometers per minute.

The chosen benchmark was a coating of titanium nitride applied by the physical vapor phase deposition technique; Table 1 hereinafter sets out and compares the results.

TABLE 1

| | Titanium nitride doped with boron in accordance with the present invention | Pure titanium nitride |
|---|---|---|
| Chemical composition | Ti 56%<br>B 22%<br>N 22% | Ti 50%<br>N 50% |
| Microhardness | 70 GPa | 25 GPa |
| Scratch test critical load | 42N | 40N |
| Wear rate | 0.04 $\mu$m/min | 0.41 $\mu$m/min |

Doping with boron retains the initial ductility of the titanium nitride whilst considerably increasing its hardness (by a factor of 2.8) and its resistance to wear (by a factor of approximately 10).

EXAMPLE 2

The procedure was as for Example 1, but the coating of titanium nitride with boron in accordance with the invention was compared with four other coatings also formed by vacuum deposition but with a composition not in accordance with the invention.

The results of the characterization tests are set out in Table 2 hereinafter.

TABLE 2

| | Deposit in accordance with the invention | Non-conform deposit N° 1 | Non-conformn deposit N° 2 | Non-conform deposit N° 3 | Non-conform deposit N° 4 |
|---|---|---|---|---|---|
| Chemical composition | Ti 56%<br>B 22%<br>N 22% | Ti 38%<br>B 56%<br>N 6% | Ti 26%<br>6 38%<br>N 36% | Ti 56%<br>B 28%<br>N 16% | Ti 80%<br>B 10%<br>N 10% |
| Micro-hardness | 70 GPa | 55 GPa | 42 GPa | 50 GPa | 38 GPa |
| Critical load | 42 N | 38 N | 36 N | 36 N | 24 N |
| Wear rate | 0.04 $\mu$m/min | 30 $\mu$m/min | 0.32 $\mu$m/min | 0.10 $\mu$m/min | 7.9 $\mu$m/min |

The four non-conform coatings (not in accordance with the invention) were also very hard but their resistance to wear was significantly lower than that in accordance with the invention.

EXAMPLE 3

The same procedure was used as in Example 1, but the partial nitrogen pressure during the reactive cathode sputtering phase was set at 0.07 Pa and the cathode power at 1.5 kW.

The coating obtained was characterized by the method described for Example 1 and compared with a chromium nitride coating commonly used to improve resistance to wear.

The results of the characterization tests are set out in Table 3 hereinafter.

TABLE 3

| | Deposit of titanium nitride doped with boron in accordance with the present invention | CrN deposit (not in accordance with the invention) |
|---|---|---|
| Chemical composition | Ti 42%<br>B 26%<br>N 32% | Cr 52%<br>N 48% |
| Microhardness | 60 GPa | 24 GPa |
| Scratch test critical load | 37N | 35N |
| Wear rate | 0.08 μm/min | 0.38 μm/min |

The coating in accordance with the invention had a hardness 2.5 times higher and a resistance to wear almost four times greater than that of the chromium nitride which is one of the solutions habitually recommended until now for improving resistance to wear.

It is claimed:

1. Titanium nitride doped with boron, crystallizing with the same structure as titanium nitride TiN, and having a Vickers microhardness greater than approximately 50 GPa.

2. Titanium nitride doped with boron as claimed in claim 1 wherein the relative proportions of its three constituents (nitrogen, titanium and boron), expressed in atomic percentages, are as follows:

4%<B<28%

18%<N<34%, the remainder being titanium.

3. Titanium nitride doped with boron as claimed in claim 2 wherein the atomic percentages of its nitrogen, titanium and boron constituents are in proportions such that:

$$\frac{B+N}{Ti} = 0.75$$

4. Titanium nitride doped with boron as claimed in claim 1 including a single metallurgical phase.

5. A coating as claimed in claim 1 having a thickness greater than approximately 1 μm.

6. An anti-wear coating comprising a compound as claimed in any one of claims 1 to 4 or 5.

7. A part having a coating of titanium nitride doped with boron, the doped nitride crystallizing with the same structure as titanium nitride TiN, and having a Vickers microhardness greater than approximately 50 GPa.

8. A part as claimed in claim 7 selected from the group consisting of metal parts, tungsten carbide parts and cermet parts.

9. A method for protecting a part from wear which comprises subjecting the part to a vacuum and depositing on such part in the vacuum titanium nitride doped with boron, the doped nitride crystallizing with the same structure as titanium nitride TiN, and having a Vickers microhardness greater than approximately 50 GPa.

10. The method claimed in claim 9 wherein said vacuum deposition is by cathode sputtering.

11. The method claimed in claim 9 including the step of vaporizing a titanium-boron compound is vaporized in a rarefied atmosphere containing nitrogen.

* * * * *